(12) United States Patent
Alqudah et al.

(10) Patent No.: US 8,064,682 B2
(45) Date of Patent: Nov. 22, 2011

(54) DEFECT ANALYSIS

(75) Inventors: Yazan A. Alqudah, Portland, OR (US); Hazem Hajj, Portland, OR (US); Mohamed Abdel Moneum, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1137 days.

(21) Appl. No.: 11/824,510

(22) Filed: Jun. 29, 2007

(65) Prior Publication Data

US 2009/0003684 A1 Jan. 1, 2009

(51) Int. Cl.
*G06K 9/00* (2006.01)
(52) U.S. Cl. ........................ 382/144; 714/724
(58) Field of Classification Search .................. 382/100, 382/141, 144–152; 714/2, 100, 724–737
See application file for complete search history.

(56) References Cited

U.S. PATENT DOCUMENTS

| | | | | |
|---|---|---|---|---|
| 5,801,954 | A | * | 9/1998 | Le et al. ........................... 716/52 |
| 6,185,707 | B1 | * | 2/2001 | Smith et al. .................... 714/724 |
| 6,578,190 | B2 | * | 6/2003 | Ferguson et al. ............... 716/53 |
| 7,382,912 | B2 | * | 6/2008 | Zhang .............................. 382/144 |
| 7,529,421 | B2 | * | 5/2009 | Beauchaine et al. .......... 382/254 |
| 7,570,796 | B2 | * | 8/2009 | Zafar et al. ..................... 382/144 |
| 7,585,600 | B2 | * | 9/2009 | Zhang ............................... 430/5 |
| 7,676,077 | B2 | * | 3/2010 | Kulkarni et al. ............... 382/144 |
| 2004/0218995 | A1 | * | 11/2004 | Graushar .......................... 412/1 |
| 2007/0156379 | A1 | * | 7/2007 | Kulkarni et al. ................ 703/14 |

\* cited by examiner

*Primary Examiner* — Manav Seth
(74) *Attorney, Agent, or Firm* — Caven & Aghevli LLC

(57) ABSTRACT

In one embodiment, a method to analyze a semiconductor wafer comprises extracting inline defect data from a data source, counting a total number of inline defects and end-of-line defects, terminating the analysis when the total number of inline defects and end-of-line defects exceeds a threshold, and mapping the inline defects onto the end-of-line defects when the total number of inline defects and end-of-line defects is less than a threshold.

5 Claims, 4 Drawing Sheets

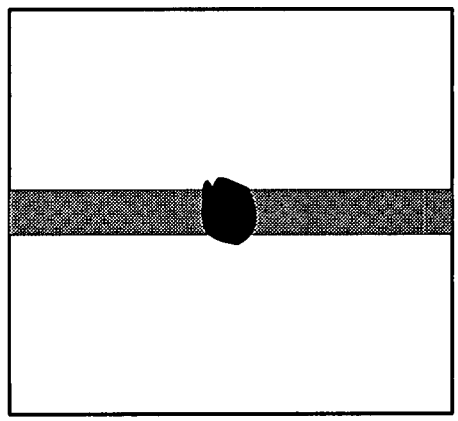
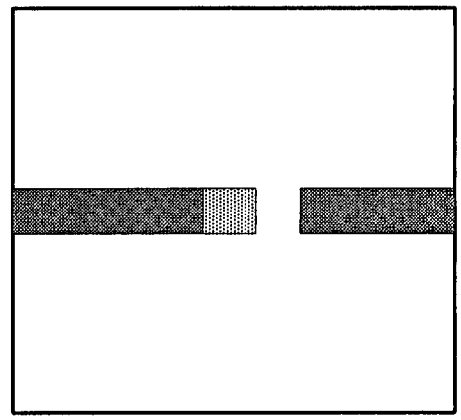
FIG. 1A   FIG. 1B
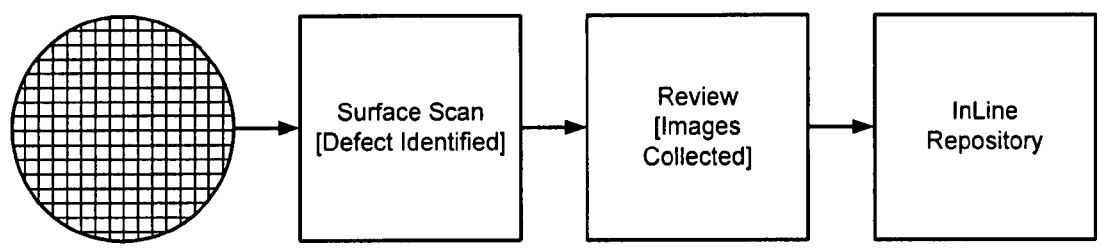
FIG. 2
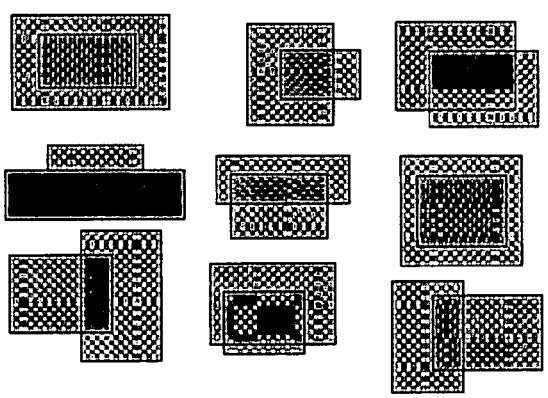
FIG. 3

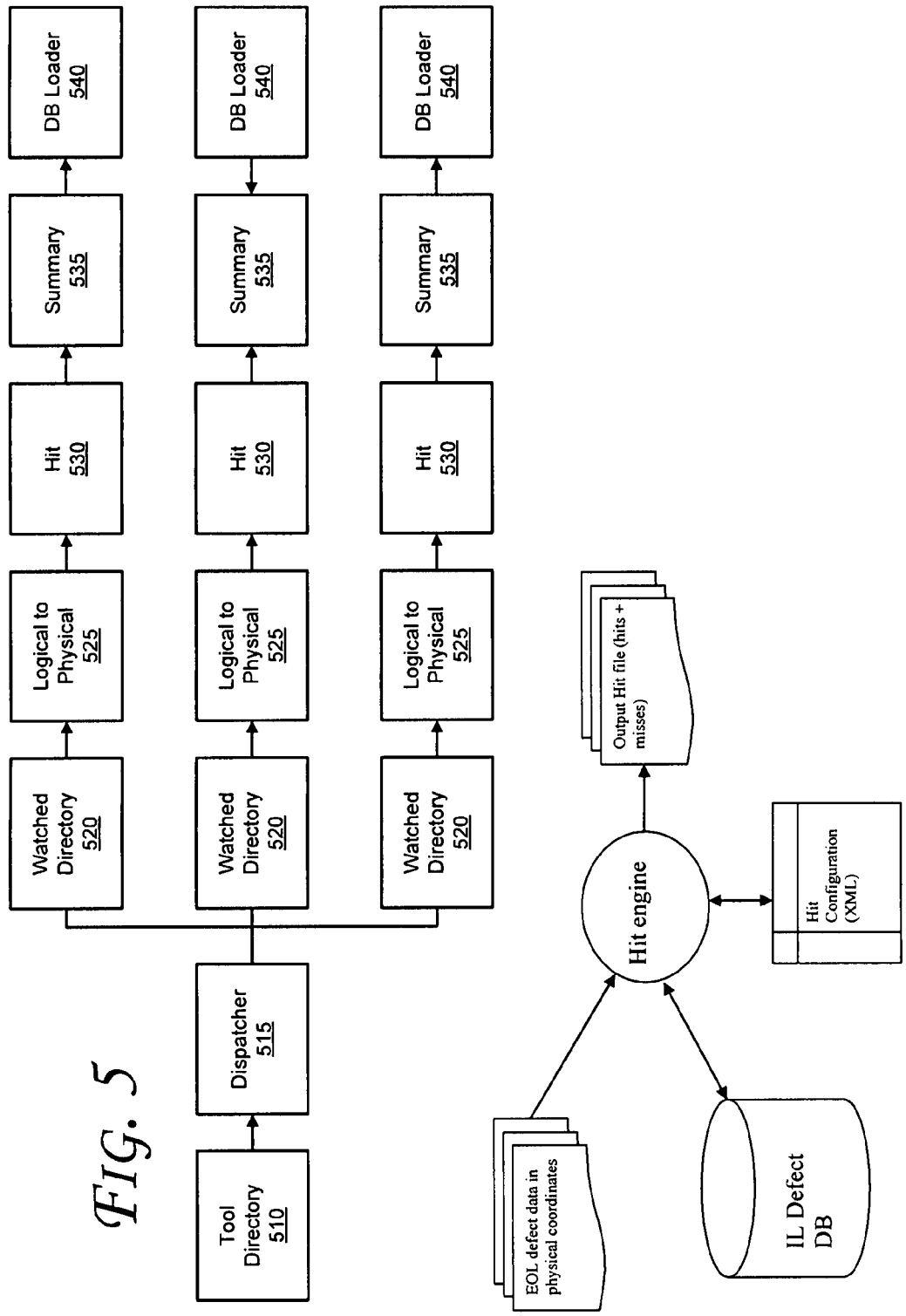

| DEFECTID | LOTID | WAFERID | STEPID | XLocationwithinReticle | YLocationwithinReticle | XReticle | YReticle | DefectXsize | DefectYsize | InspectionTime |

DEFECT ANALYSIS

BACKGROUND

The subject matter described herein relates generally to semiconductor processing, and more particularly to defect analysis.

Semiconductor technology has been following Moore's law for more than three decades. The number of transistors doubles per technology generation by continuous shrink of critical dimensions. As a result, the complexity of manufacturing process increases due to increase in number of process steps, reduced technology development window and the need to develop a profitable product. Yield analysis engineers play a critical rule in ensuring process technology development is optimized by providing a quick learning to process engineers. Yield engineers are also responsible in high volume manufacturing for ensuring manufacturing line is healthy and by preventing any problems that can cause excursions.

BRIEF DESCRIPTION OF THE DRAWINGS

The disclosed embodiments will be better understood from a reading of the following detailed description, taken in conjunction with the accompanying drawings in which:

FIGS. 1A-1B are schematic illustrations of a semiconductor wafer that exhibits defects, according to an embodiment.

FIG. 2 is a schematic illustration of a metrology process, according to an embodiment.

FIG. 3 is a schematic illustration of possible overlaps between an inline defect and an end-of-line defect that constitutes a hit, according to an embodiment.

FIG. 4 is a schematic illustration of a hit engine topology, according to an embodiment FIG. 5 is a schematic illustration of operations of a hit engine, according to embodiments.

DETAILED DESCRIPTION

Figures 6, 7:
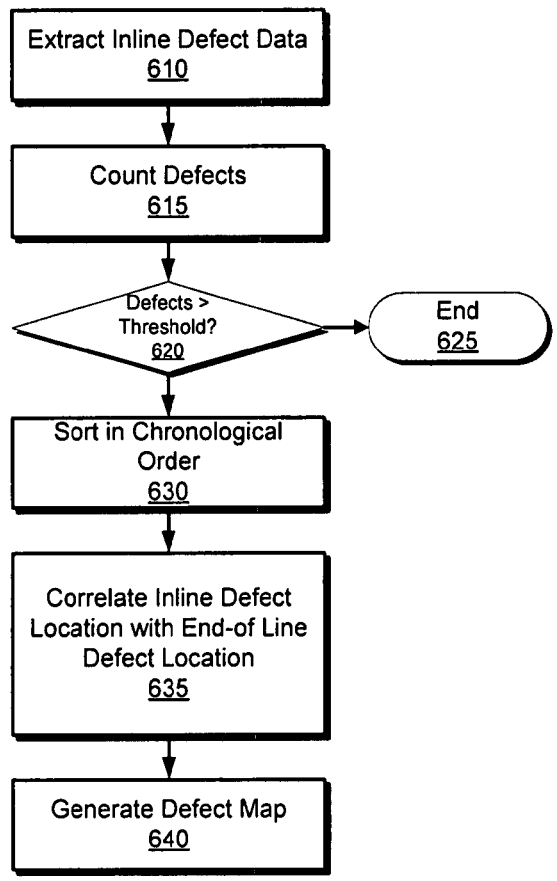
FIG. 6 is a flowchart illustrating a method to analyze a semiconductor wafer, according to embodiments.
FIG. 7 is a schematic illustration of a data arrangement, according to embodiments.

To accelerate yield learning, several tools and analysis methods are used to build a complete yield model that incorporates process and device variations, defects types, and defects impact. One of the critical tools needed to build a comprehensive process yield model is the End-Of-Line (EOL) to In-Line (IL) defect correlation, referred to herein as Hit Analysis tool (engine). This document a new Hit analysis engine design and architecture that enables fast, efficient and scalable tool. The architecture enables the tool to run in real time automated mode to generate Hit results as soon as electrical failure testing of a wafer is completed.

The semiconductor manufacturing process starts with a bare silicon wafer that is almost defect free surface (assuming no contamination or particles deposited) that goes through clean steps and then through many steps that includes film deposition, doping, patterning (lithography and etch), anneal, and polish. Defects may be characterized by presence of an unintended object, absence of an object, or failure of a step to meet specifications. Each step results in different types of defects as shown in FIG. 1. In FIG. 1A, an etch process can results in un-etched features or flakes; a particle that lands on the wafer either during transpiration between different modules or from one of the processing tools. This defect can propagate to layers other than the starting layer and potentially lead to electrical failure at the EOL.

Each active step in the manufacturing process may be followed by a defect metrology step. During defect metrology, a wafer is scanned and reviewed by engineers to identify and classify defects. Images are also captured on selected set of defects. Defect data is loaded to a centralized storage (database) as topology, as illustrated in FIG. 2.

After completing process steps, a wafer goes to sort/test operation where testers perform electrical testing of memory cells and write results to raster files. These files contain classifications of EOL failures based on the spatial signature of failures i.e. single bit, full column full density, double bit, etc. The files contain logical coordinates of a defect by specifying start and end locations. A logical location of a defect does not necessarily correspond to a physical location. Instead, logical coordinates have to be transformed to physical coordinates based on known device structure such as die physical locations, sub die structure and cells size and locations within a die. After the transformation of EOL coordinates, defects can be correlated to inline defects to identify an IL defect responsible for an EOL failure and the corresponding IL step (layer). If an inline layer defect is correlated with EOL defect, the pair is referred to as a hit, if no IL defect is identified; the EOL is labeled as a miss. Both hits and misses are then summarized to generate defect level rollups. The data is then loaded to a database to generate key yield indicators and trends.

In order to appreciate the calculation complexity associated with Hit analysis, consider a wafer with N steps, each generating M defects and EOL defects count of P. To identify hits each EOL defects has to be overlaid over N×M defects resulting in N×M×P comparisons. The number of comparisons for a wafer during technology development can exceed 20,000,000,000. Hence, there is a need for an automated and scalable tool that can efficiently perform hit analysis for all sorted wafers with minimal data latency.

In one embodiment, a hit algorithm starts by extracting inline data from a centralized database. For each wafer, defect id, step id, defect information, and inspection time are extracted. The algorithm arranges in-line data in ascending chronological order. This ensures early steps are considered first in hit calculations. To enable scalability i.e. enabling of processing of any large EOL defect file, the algorithm loops through EOL defects sequentially and query inline data to select all defects that overlap its boundaries using overlap definition in FIG. 3. If inline defects are found, the EOL is a hit and is associated with first defect in the inline defect list (this is the oldest defect on wafer). If no data are returned, the EOL is a miss and no association is created.

Since the algorithm loops through all EOL defects, the algorithm will be able to handle the case where a single inline defect results in multiple EOL defects. In this case, multiple EOL defects are associated with a single inline defect.

The topology of hit engine is illustrated in FIG. 4. The engine requires two data sources: EOL data and IL data. The inline data is extracted from a centralized database. The information about the database is stored in hit engine configuration file. The configuration file also contains step ids to consider when inline data is extracted. For each device, an independent set of steps can be defined. This ensures that fake or invalid step ids are not extracted and thus does not impact hit results.

In order to automate hit analysis and generate analysis for users, several supporting engines are needed. The first engine is responsible for converting tool generated logical coordinates to physical coordinates. Each defect is given a unique id to help identify it. Another engine that operates on Hit Engine output is the Summary Engine (SE). The SE calculates summary data based on hit results on wafer level. For each wafer, step id impact is calculated i.e. number of hits a step generated, die summary i.e. number of hits and misses for each die on the wafer. The results of hit and summary engines are then loaded to a centralized DB where it can be used later to generate trends on lots and device level.

In order to execute engines in a sequence, a flow concept is created. A flow consists of executable objects (Engines) that are responsible for providing a capability. The engines in a flow are executed in a sequence such that when an engine is called, execution of previous engine is completed. Each flow is associated with a unique watch directory and has its own work directory where files are processed. Typically, each engine is associated with a unique input/output file name. Thus, when an engine is called it looks for its input file in the work directory.

Since a typical manufacturing environment tools are operated continuously, automating the tool and enabling real time processing reduces information turn around by minimizing wafers wait time before they are processed. As multiple tools are responsible for generating files and to reduce contention between concurrent wafers, multiple independent flows for generating hit analysis are created as illustrated in FIG. 5.

The dispatcher is responsible for watching a tool directory where raster files are written by testers. Upon file arrival the dispatcher forward the file randomly to one of the available flows. The random forwarding of files is chosen since no prior knowledge about wafer processing time is known as this depends on number of inline defects collected which is known to dispatcher. Although more sophisticated dispatcher that considers the load on each flow before forwarding files is possible. The current implementation resulted in no data latency after a year of operation.

FIG. 6 is a flowchart illustrating a method detecting an alignment of a wafer, according to embodiments. Referring to FIG. 6, at operation 610 inline defect data is extracted from a data source such as a metrology data file. In some embodiments, extracting inline information from a data source comprises extracting information about a defect location, a layer on which the defect resides, and an inspection time, as illustrated in FIG. 7. In some embodiments the data may be sorted into columns that contain information about defect boundary locations (XlocationInlineDefectStart, YlocationInlineDefectStart, XlocationInfineDefectEnd, and YlocationInlineDefectEnd). Each location incorporates a tolerance value specified in Configuration file. Similar calculation is applied to end-of-line input data.

At operation 610 a total number of inline defects and end-of-line defects is counted. If, at operation 620, the number of inline defects and end-of-line defects exceeds a threshold, then the analysis may be stopped and the wafer may be classified as defective. By contrast, if the number of defects does not exceed a threshold, then the inline defects are mapped onto the end-of-line defects.

At operation 625 inline data is sorted in chronological order, and at operation 635 inline defect locations and data are correlated with end-of-line defect locations and data to determine which inline defects are hits to the end-of-line defects. In one embodiment, the data may be correlated using the tests defined by the pseudocode in Table 1. At operation 640 a defect map is generated. The defect map may be presented on a suitable user interface such as a display or printed onto paper.

TABLE 1

```
dtInLine << select where(
(
((EOLXstart > XlocationInlineDefectStart & EOLXstart < XlocationInlineDefectEnd)|
( EOLXend > XlocationInlineDefectStart & EOLXend < XlocationInlineDefectEnd))
And
((EOLYstart > YlocationInlineDefectStart & EOLYstart < YlocationInlineDefectEnd) |
( EOLYend > YlocationInlineDefectStart & EOLYend < YlocationInlineDefectEnd))
)
OR
(
(( EOLXstart <XlocationInlineDefectStart& EOLXend > XlocationInlineDefectEnd) )
&
((EOLYstart > YlocationInlineDefectStart & EOLYstart < YlocationInlineDefectEnd ) |
( EOLYend > YlocationInlineDefectStart & EOLYend < YlocationInlineDefectEnd ))
)
OR
(
(( EOLYstart < YlocationInlineDefectStart & EOLYend > YlocationInlineDefectEnd) )
And
((EOLXstart > XlocationInlineDefectStart& EOLXstart < XlocationInlineDefectEnd ) |
( EOLXend > XlocationInlineDefectStart& EOLXend < XlocationInlineDefectEnd))
)
OR
(
(EOLXstart < XlocationInlineDefectStart& EOLXend > XlocationInlineDefectEnd)
AND
(EOLYstart < YlocationInlineDefectStart & EOLYend > YlocationInlineDefectEnd)
)
);
```

In another embodiment, a test mode analysis engine dynamically defines a set of testmode (circuit failures) classifications that the algorithm incorporates in its circuit analysis to determine circuit failure class. In addition, the testmode analysis engine may add a confidence measure to a final classification.

The test mode analysis engine is executed by passing a configuration file (Table 2) end of line inspection table that contains test mode current sweeps. For each device name 2 configuration files are specified:

XLYAIposInegDefault.JMP contains information about default values to use in the algorithm to calculate reference currents.

TestmodeTranslation contains information about how test modes definitions as show in Table 3.

TABLE 2

```
<TestmodeEngine>
 <DeviceConfiguration>
  <Device>deviceName</Device>
  <Alpha>1</Alpha>
  <IposInegDirFile>E:\ Config\
  XLYAIposInegDefault.JMP</IposInegDirFile>
   <TestModeTransDirFile
   dt:dv="string">E:\Config\
   TestmodeTranslation.JMP</TestModeTransDirFile>
 </DeviceConfiguration>
</TestModeEngine>
```

TABLE 3

| index | Classification | Characterstics | BLRL | BLRH | BL#RL | BL#RH | PCRL | PCRH | PC#RL | PC#RH |
|---|---|---|---|---|---|---|---|---|---|---|
| 1 | BitLineOpen | OPENS | ISKIP | IZERO | ISKIP | IZERO | IZERO | ISKIP | IZERO | ISKIP |
| 2 | BitLineBarOpen | OPENS | ISKIP | IZERO | ISKIP | IPOS | IZERO | ISKIP | ISKIP | IPOS |
| 4 | VccisOpen | OPENS | IZERO | IPOS | IZERO | IPOS | IZERO | ISKIP | IZERO | ISKIP |
| 31 | BLShorts | SHORTS | ISHN | ISHP | ISHN | ISKIP | ISHN | ISHP | ISHN | ISKIP |

In one embodiment, the implementation starts by calculating two reference currents according to the pseudocode in Table 4

TABLE 4

If number of good dies on wafer < Min Good then Use Default Ipositive and I negative
Else
Ipositive = Average of BLRH where raster class = 'Good' and
Inegative = Average of PCRL where raster class = 'Good'

Based on Ipositive and Inegative, the implementation defines a set of current references as depicted in Table 5. These values substituted in TestmodeTranslation table define expected measured values for each test mode classification.

TABLE 5

```
IZEROL=(2);
IVSMNL= floor(0.1*Ipositive);
ISMNL= floor(0.05*Ipositive)+floor(0.3*Inegative) ;
INEGL= floor(0.6*Inegative);
ILGNL= floor(1.4*Inegative);
IVLGNL=floor(2.2*Inegative);
ISHNL=floor(3*Inegative);
ISHNH=floor(4*Inegative);
IVSMPL=floor(0.1*Ipositive);
ISMPL=floor(0.35*Ipositive);
IPOSL=floor(0.6*Ipositive);
ILGPL=floor(1.2*Ipositive);
IVLGPL=floor(1.8*Ipositive);
ISHPL=floor(2.5*Ipositive);
ISHPH =floor(3*Ipositive);
Isum2 = floor(1.8*Ipositive) + floor(2.2 * Inegative);
Isum3 = floor(5*Ipositive) + floor(6*Inegative);
```

In one embodiment, the algorithm implements the following functions:

TriangularFxnLowEdge=function(Icenter,Iright,Irightmost,CurrentValue).
TriangularFxnHighEdge=function(Ileftmost,Ileft,Icenter, CurrentValue).
TriangularFxn=function(Ileftmost,Ileft,Icenter,Iright, Irightmost,CurrentValue)

Figure 8:
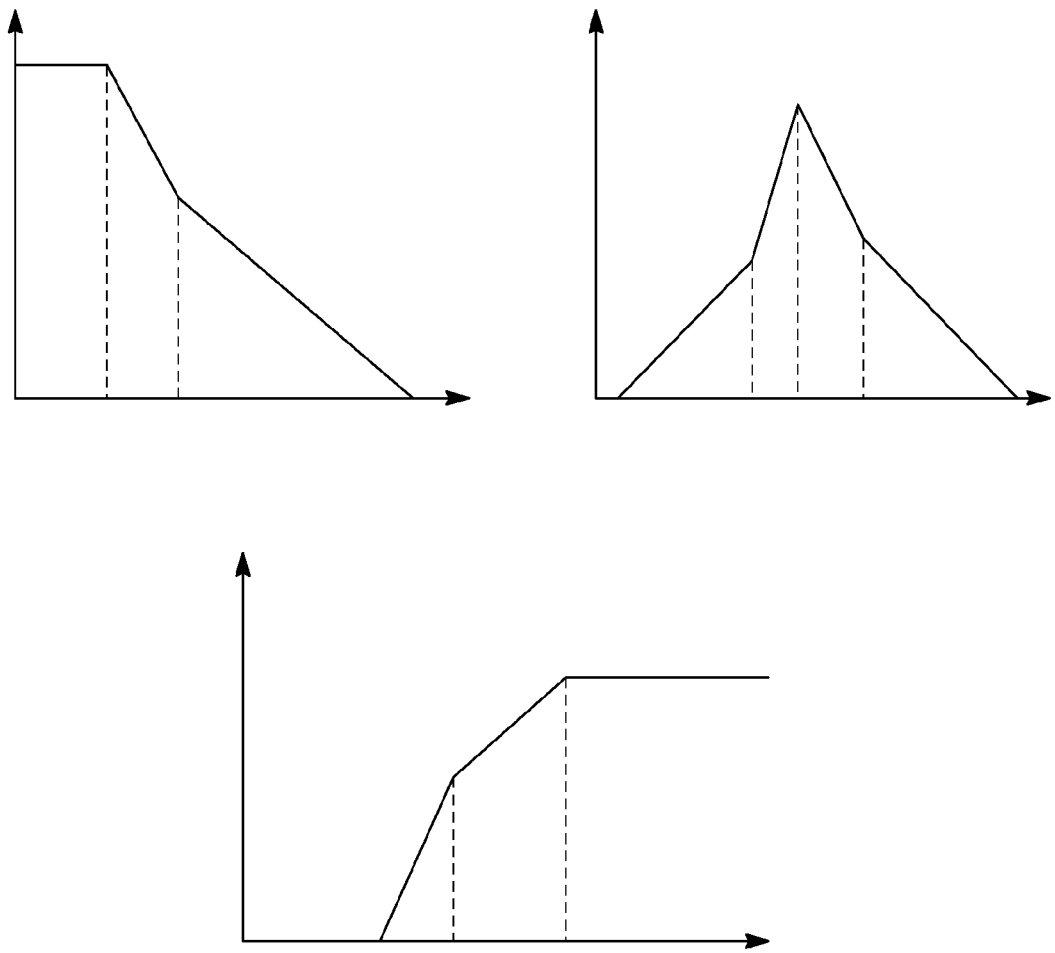
FIG. 8 is a schematic illustration of membership functions, according to embodiments.

The functions calculate a membership value given current measurements as illustrated in FIG. 8.

BestCall=function(X). In one embodiment the BestCall function takes a matrix X with n rows and m columns and forms a set of n vector V from the rows of matrix X. For each row, values are sorted in ascending order. The function then searches for columns to find the row that has maximum value. If two rows have equal column value, the function moves to next column. Therefore, the function returns the vector that has the highest row values where column i is ranked with more value that column i+1. The implementation defines constants according to Table 5.

In some embodiments the implementation proceeds by extracting three tables from TestmodeTranslation. Tables contain open, short and others classifications. The implementation loops through all defects that have currents, for each defect i, a vector V is formed that is composed of measured currents for that defect V=[abs(BLRL)[i]),abs("BLRH)[i]),abs(BL#RL)[i]),abs (BL#RH)[i]),abs(PCRL)[i]),a bs(Column(PCRH)[i]),abs( (PC#RL)[i]), abs(PC#RH)[i]];

The implementation calculates negative and positive distances to all reference currents, Dn and Dp, respectively according to Table 6.

Based on the sum of current in V, the implementation decides if the call should be in short, opens or others according to if (CurrentSum>=Isum3, circuit is short),
if (CurrentSum<Isum2, circuit is open) else others.

Based on the current categories, the algorithm calculates the distance matrix to calls corresponding to that category as shown in FIG. 7.

The algorithm calls BestCall function by passing the distance matrix. The function returns the testmode call with maximum likelihood. The algorithm defines a confidence measure that is equal to the minimum distance value in the distance vector of the call.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" "some embodiments" or "an embodiment" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method to analyze a semiconductor wafer, comprising:
    extracting inline defect data from a data source;
    counting a total number of inline defects and end-of-line defects;
    terminating the analysis when the total number of inline defects and end-of-line defects exceeds a threshold; and
    mapping the inline defects onto the end-of-line defects when the total number of inline defects and end-of-line defects is less than a threshold.

2. The method of claim 1, wherein extracting inline information from a data source comprises extracting information about a defect location, a layer on which the defect resides, and an inspection time.

3. The method of claim 1, wherein mapping the inline defects onto the end-of-line defects when the total number of inline defects and end-of-line defects is less than a threshold comprises sorting the inline defect data in a chronological order.

4. The method of claim 1, mapping the inline defects onto the end-of-line defects when the total number of inline defects and end-of-line defects is less than a threshold comprises obtaining sorting location data relating to the inline defects.

5. The mask of claim 1, wherein mapping the inline defects onto the end-of-line defects when the total number of inline defects and end-of-line defects is less than a threshold comprises correlating a location of an inline defect with a location of an end-of-line defect.

* * * * *